(12) United States Patent
Powell et al.

(10) Patent No.: US 8,785,946 B2
(45) Date of Patent: Jul. 22, 2014

(54) LOW 1C SCREW DISLOCATION 3 INCH SILICON CARBIDE WAFER

(71) Applicant: Cree, Inc., Durham, NC (US)

(72) Inventors: Adrian Powell, Cary, NC (US); Mark Brady, Carrboro, NC (US); Stephan G. Mueller, Durham, NC (US); Valeri F. Tsvetkov, Gasburg, VA (US); Robert T. Leonard, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/776,784

(22) Filed: Feb. 26, 2013

(65) Prior Publication Data

US 2013/0161651 A1 Jun. 27, 2013

Related U.S. Application Data

(60) Continuation of application No. 11/940,454, filed on Nov. 15, 2007, now Pat. No. 8,384,090, which is a division of application No. 10/957,806, filed on Oct. 4, 2004, now Pat. No. 7,314,520.

(51) Int. Cl.
*H01L 29/24* (2006.01)

(52) U.S. Cl.
USPC ........ 257/77; 257/76; 257/E29.104; 438/745; 117/84; 117/109

(58) Field of Classification Search
None
See application file for complete search history.

(56) References Cited

U.S. PATENT DOCUMENTS

| | | |
|---|---|---|
| 4,387,503 A | 6/1983 | Aswell et al. |
| 4,543,594 A | 9/1985 | Mohsen et al. |
| 4,605,872 A | 8/1986 | Rung |
| 4,777,471 A | 10/1988 | Comer |
| 4,779,126 A | 10/1988 | Herman |
| 4,799,126 A | 1/1989 | Kruse et al. |
| 4,860,185 A | 8/1989 | Brewer et al. |
| 4,866,005 A | 9/1989 | Davis et al. |
| 4,885,477 A | 12/1989 | Bird et al. |
| 4,894,791 A | 1/1990 | Jiang et al. |
| 4,910,508 A | 3/1990 | Yamazaki |
| 5,021,861 A | 6/1991 | Baliga |
| RE34,861 E | 2/1995 | Davis et al. |
| 5,539,217 A | 7/1996 | Edmond et al. |
| 5,663,580 A | 9/1997 | Harris et al. |

(Continued)

FOREIGN PATENT DOCUMENTS

| | | |
|---|---|---|
| EP | 1143033 A | 10/2001 |
| JP | 05-262599 A | 10/1993 |

(Continued)

OTHER PUBLICATIONS

Cree, Inc., Chinese Patent Application No. 200580033838.X, Third Office Action, Jul. 24, 2012.

(Continued)

*Primary Examiner* — Minh-Loan T Tran
*Assistant Examiner* — Fazli Erdem
(74) *Attorney, Agent, or Firm* — Steven B. Phillips; Moore & Van Allen PLLC

(57) ABSTRACT

A high quality single crystal wafer of SiC is disclosed having a diameter of at least about 3 inches and a 1 c screw dislocation density from about 500 $cm^{-2}$ to about 2000 $cm^{-2}$.

21 Claims, 3 Drawing Sheets

(56) References Cited

U.S. PATENT DOCUMENTS

| | | | |
|---|---|---|---|
| 5,766,343 A | 6/1998 | Dmitriev et al. | |
| 5,873,937 A | 2/1999 | Hopkins et al. | |
| 5,883,403 A | 3/1999 | Ishikawa et al. | |
| 5,915,194 A * | 6/1999 | Powell et al. | 438/478 |
| 5,929,482 A | 7/1999 | Kawakami et al. | |
| 5,944,890 A | 8/1999 | Kitou et al. | |
| 5,958,132 A | 9/1999 | Takahashi et al. | 117/84 |
| 6,077,619 A | 6/2000 | Sullivan | |
| 6,143,267 A | 11/2000 | Tanino | |
| 6,165,874 A * | 12/2000 | Powell et al. | 438/478 |
| 6,214,108 B1 | 4/2001 | Okamoto et al. | 117/95 |
| 6,217,842 B1 | 4/2001 | Tanino | |
| 6,218,680 B1 | 4/2001 | Carter et al. | |
| 6,488,771 B1 | 12/2002 | Powell et al. | 117/89 |
| 6,562,130 B2 | 5/2003 | Vodakov et al. | |
| 6,596,080 B2 | 7/2003 | Kawahara et al. | |
| 6,657,276 B1 | 12/2003 | Karlsson et al. | |
| 6,734,461 B1 | 5/2004 | Shiomi et al. | 257/77 |
| 6,754,104 B2 | 6/2004 | King | |
| 6,824,611 B1 | 11/2004 | Kordina et al. | |
| 6,995,036 B2 | 2/2006 | Nishino et al. | |
| 7,033,912 B2 | 4/2006 | Saxler | |
| 7,192,482 B2 | 3/2007 | Mueller et al. | |
| 7,300,519 B2 | 11/2007 | Tsvetkov et al. | 117/97 |
| 7,449,065 B1 * | 11/2008 | Powell et al. | 117/84 |
| 7,601,441 B2 | 10/2009 | Jenny et al. | |
| 8,410,488 B2 * | 4/2013 | Basceri et al. | 257/77 |
| 2002/0023581 A1 * | 2/2002 | Vodakov et al. | 117/108 |
| 2002/0038627 A1 | 4/2002 | Vodakov et al. | |
| 2002/0189536 A1 | 12/2002 | Otsuki et al. | |
| 2003/0040167 A1 | 2/2003 | Nagasawa et al. | 438/486 |
| 2003/0070611 A1 * | 4/2003 | Nakamura et al. | 117/109 |
| 2003/0233975 A1 | 12/2003 | Jenny et al. | |
| 2004/0069212 A1 | 4/2004 | Neudeck et al. | 117/84 |
| 2004/0187766 A1 | 9/2004 | Letertre | 117/11 |
| 2005/0022724 A1 | 2/2005 | Malta et al. | |
| 2005/0022727 A1 | 2/2005 | Fechko et al. | |
| 2005/0042800 A1 | 2/2005 | Yamada et al. | |
| 2005/0126471 A1 | 6/2005 | Jenny et al. | 117/92 |
| 2005/0145164 A9 | 7/2005 | Malta et al. | |
| 2005/0211156 A1 * | 9/2005 | Gunjishima et al. | 117/2 |
| 2008/0020212 A1 | 1/2008 | Ohtani et al. | 428/446 |
| 2012/0211765 A1 * | 8/2012 | Miyoshi et al. | 257/76 |
| 2013/0280466 A1 * | 10/2013 | Zwieback et al. | 428/64.1 |

FOREIGN PATENT DOCUMENTS

| | | |
|---|---|---|
| JP | 2917149 B1 | 7/1999 |
| JP | 2003-176200 A | 6/2003 |
| JP | 2003-183097 A | 7/2003 |
| JP | 2003-321298 A | 11/2003 |
| JP | 2004031470 A | 1/2004 |
| TW | 440989 B | 6/2001 |
| TW | 489143 | 6/2002 |
| TW | 514685 B | 12/2002 |
| TW | 552325 B | 9/2003 |
| TW | 482833 B | 4/2004 |
| TW | 583354 B | 4/2004 |
| TW | 583733 B | 4/2004 |
| WO | 0118872 A1 | 3/2001 |
| WO | 01/68954 A | 9/2001 |

OTHER PUBLICATIONS

Cree, Inc., European Application No. 05798669.7-2122, Summons for Oral Proceedings, Jul. 12, 2012.

Cree, Inc., Japanese Patent Application No. 2007-534681, Appeal Decision dated Apr. 6, 2012.

Cree, Inc., Japanese Patent Application No. 2008-202193, Office Action dated Mar. 16, 2012.

Neudeck, P.G., et al., Breakdown Degradation Associated With Elementary Screw Dislocations in 4H-SiC p+n Junction Rectifiers, Solid-State Electronics, 1998, pp. 2157-2164, vol. 42, No. 12.

Giocondi, J., et al., An Atomic Force Microscope Study of Super-Dislocation/Micropipe Complexes on the 6H-SiC (0001) Growth Surface, The Journal of Crystal Growth, 1997, pp. 1-30, vol. 181, No. 351.

Cree, Inc., Japanese Application No. 2008-202193, Office Action dated Aug. 30, 2011, 6 pages.

Cree, Inc., Korean Application No. 10-2007-7007696, Appellee's Supplemental Brief dated Aug. 8, 2011, 3 pages.

Cree, Inc., European Application No. 05798669.7, Amendment dated Jun. 7, 2007, 6 pages.

Cree, Inc., European Application No. 05798669.7, Reply dated May 23, 2011, 12 pages.

Allen, S.T., et al., Invited—Progress in High Power SiC Microwave MESFETs, IEEE MTT-S Digest, 1999, pp. 321-324.

Kim, S., Trend of SiC Power Semiconductor, 2004, 6 pages.

Cree, Inc., Korean Intellectual Property Office, Reply Brief issued for Application No. 10-2007-7007696, dated May 6, 2011, 63 pages.

Cree, Inc., European Patent Office, EP Office Action issued for Application No. 05798669.7, dated Jan. 24, 2011, 4 pages.

Cree, Inc., Korean Intellectual Property Office, Office Action with mailing date of Feb. 21, 2009, for Application No. 10-2007-7007696 with English summary page.

Cree, Inc., Korean Intellectual Property Office, Office Action with mailing date of Jun. 1, 2009, for Application No. 10-2007-7007696 with English summary page.

Cree, Inc. Japan Patent Office, Decision of Rejection, dispatch date of Mar. 30, 2010, for Application No. 2007-534681.

Cree, Inc. English translation of Japan Patent Office, Decision of Rejection, dispatch date of Mar. 30, 2010, for Application No. 2007-534681.

Japanese Office Action in counterpart Japanese Application No. 2007-534681, dated Sep. 4, 2009.

English translation of Japanese Office Action in counterpart Japanese Application No. 2007-534681, dated Sep. 4, 2009.

Chinese Office Action in counterpart Chinese Application No. 200580033838.X, issued on Aug. 21, 2009.

English translation of Chinese Office Action in counterpart Chinese Application No. 200580033838.X, issued on Aug. 21, 2009.

Wahab, Q. et al., Influence of epitaxial growth and substrate-induced defects on the breakdown of 4H-SiC Schottky diodes, Applied Physics Letters, vol. 76, No. 19, May 8, 2000.

Japanese Office Action in counterpart Japanese Application No. 2007-534681, dated Mar. 27, 2009.

English translation of Japanese Office Action in counterpart Japanese Application No. 2007-534681, dated Mar. 27, 2009.

Partial English translation of Japanese Application No. 2007-534681 (previously cited on Jan. 19, 2009, under Publication No. 2003-183097).

International Preliminary Report on Patentability in counterpart International Application No. PCT/US2005/034351, completed on Dec. 21, 2006.

English translation of Japanese Office Action in counterpart Japanese Application No. 2007-534681, mailed on Nov. 7, 2008.

International Search Report and Written Opinion in corresponding International Application No. PCT/US2005/034351, mailed on Apr. 6, 2006.

Muller et al., "Defects in SiC substrates and epitaxial layers affecting semiconductor device performance," European Physical Journal, Applied Physics EDP Sciences France, vol. 27, No. 1-3, Jul. 2004, pp. 29-35.

Wang et al, "Growth of 3-inch diameter 6H-SiC single crystals by sublimation physical vapor transport," Materials Science Forum Trans Tech Publications, Switzerland, vol. 389-393, 2002, pp. 35-38.

Yoganathan et al., "Growth of large diameter semi-insulating 6H-SiC crystals by physical vapor transport," Silicon Carbide 2004-Materials, Processing and Devices (Materials Research Society Symposium Proceedings vol. 815), Materials Research Soc. Warrendale, PA, USA, 2004, pp. 21-26.

Korean Office Action in corresponding Korean Application No. 10-2007-7007696, dated Dec. 26, 2007 (with English summary).

Korean Office Action in corresponding Korean Application No. 10-2007-7007696, dated Jul. 24, 2008 (with English summary).

(56) References Cited

OTHER PUBLICATIONS

English translation of Taiwanese Office Action in corresponding Taiwanese Application No. 094134555, dated Apr. 27, 2007.
English translation of Taiwanese Office Action in corresponding Taiwanese Application No. 094134555, dated Jan. 28, 2008.
Roland Madar; Materials science: Silicon carbide in contention; Nature; Aug. 26, 2004; vol. 430, pp. 974-975.
Daisuke Nakamura et al.; Ultrahigh-quality silicon carbide single crystals; Nature; Aug. 26, 2004; vol. 430, pp. 1009-1012.
Edward K. Sanchez et al.; Formation of Thermal Decomposition Cavities in Physical Vapor Transport of Silicon Carbide; Journal of Electronic Materials; vol. 29, No. 3 (2000); pp. 347-352.
Adrian Powell et al.; Growth of Low Micropipe Density SIC Wafers; Materials Science Forum; vols. 338-342 (2000); pp. 437-440.
Thomas A. Kuhr et al.; Hexagonal voids and the formation of micropipes during SiC sublimation growth; Journal of Applied Physics; Apr. 15, 2001; vol. 89, No. 8; pp. 4625-4630.
Cree, Inc., European Application No. 13151964.7, Extended European Search Report, Mar. 4, 2013.
Cree, Inc., Japanese Application No. 2012-137108, Office Action, May 7, 2013.
Cree, Inc., Japanese Application No. 2008-202193, Decision of Rejection and Decision of Declining Amendment, Dec. 21, 2012.
Cree, Inc., European Application No. 05798669.7, Notice of Opposition, Dec. 13, 2013.
Muller, St. G., et al., The status of SiC bulk growth from an industrial point of view, Journal of Crystal Growth, 2000, vol. 211, pp. 325-332.
Bakin, A.S., et al., State-of-the-art in defect control of bulk SiC, Invited Talk at the Engineering Foundation Conference on High-Temperature Electronic Materials, Devices and Sensors, San Diego, California, Feb. 22-27, 1008, pp. 2-13.
Skowronski, M., AASERT—Fabrication and Characterization of Photoconductive AlGaN Detectors/Structural Characterization of SiC Wafers, Final Technical Report, AFOSR Grant F49620-97-1-0452, 2000.
Neudeck, P.G., SiC Technology, NASA, 1998.
Adesida, I., et al., GaN Heterostructure Field Effect Transistors, 1998, GAAS, pp. 193-198.

* cited by examiner

LOW 1C SCREW DISLOCATION 3 INCH SILICON CARBIDE WAFER

CROSS REFERENCES TO RELATED APPLICATION

This application is a continuation application of and claims priority from U.S. application Ser. No. 11/940,454, filed Nov. 15, 2007, now U.S. Pat. No. 8,384,090, which is a divisional application of U.S. application Ser. No. 10/957,806, filed Oct. 4, 2004, now U.S. Pat. No. 7,314,520, the entire disclosures of both of which are hereby incorporated by reference.

STATEMENT OF GOVERNMENT INTEREST

This invention was developed under Office of Naval Research/DARPA Contract No. N00014-02-C-0306. The government may have certain rights in this invention.

BACKGROUND OF THE INVENTION

The present invention relates to low defect silicon carbide wafers and their use as precursors for semiconductor purposes, and to seeded sublimation growth of large, high-quality silicon carbide single crystals.

Silicon carbide has found use as semiconductor material for various electronic devices and purposes in recent years. Silicon carbide is especially useful due to its physical strength and high resistance to chemical attack. Silicon carbide also has excellent electronic properties, including radiation hardness, high breakdown field, a relatively wide band gap, high saturated electron drift velocity, high-temperature operation, and absorption and emission of high-energy photons in the blue, violet, and ultraviolet regions of the spectrum.

Single crystal silicon carbide is often produced by a seeded sublimation growth process. In a typical silicon carbide growth technique, the seed crystal and a source powder are both placed in a reaction crucible which is heated to the sublimation temperature of the source and in a manner that produces a thermal gradient between the source and the marginally cooler seed crystal. The thermal gradient encourages vapor phase movement of the materials from the source to the seed followed by condensation upon the seed and the resulting bulk crystal growth. The method is also referred to as physical vapor transport (PVT).

In a typical silicon carbide growth technique, the crucible is made of graphite and is heated by induction or resistance, with the relevant coils and insulation being placed to establish and control the desired thermal gradient. The source powder is silicon carbide, as is the seed. The crucible is oriented vertically, with the source powder in the lower portions and the seed positioned at the top, typically on the seed holder; see U.S. Pat. No. 4,866,005 (reissued as No. Re34,861) the contents of which are incorporated entirely herein by reference. These sources are exemplary, rather than limiting, descriptions of modern seeded sublimation growth techniques.

The invention is also related to the following copending and commonly assigned U.S. applications: U.S. Pat. No. 7,147,715 issued Dec. 12, 2006 for Growth of Ultra-High Purity Silicon Carbide Crystals in an Ambient Containing Hydrogen; U.S. Pat. No. 7,220,313 issued May 22, 2007 for Reducing Nitrogen Content in Silicon Carbide Crystals by Sublimation Growth in a Hydrogen-Containing Ambient; U.S. Pat. No. 7,033,912 issued Apr. 25, 2006 for Silicon Carbide on Diamond Substrates and Related Devices and Methods; U.S. Ser. No. 60/522,326 filed Sep. 15, 2004 for Seed Preparation for the Growth of High Quality Large Size Silicon Carbide Crystals; U.S. Pat. No. 7,192,482 issued Mar. 20, 2007 for Seed and Seedholder Combinations for High Quality Growth of Large Silicon Carbide Single Crystals; and U.S. Pat. No. 7,601,441 issued Oct. 13, 2009 for One Hundred Millimeter High Purity Semi-Insulating Single Crystal Silicon Carbide Wafer. The contents of these applications are likewise incorporated entirely herein by reference.

Although the density of structural defects in silicon carbide bulk crystals has been continually reduced in recent years, relatively high defect concentrations still appear and have been found to be difficult to eliminate, e.g. Nakamura et al., "Ultrahigh quality silicon carbide single crystals," *Nature*, Vol. 430, Aug. 26, 2004, page 1009. These defects can cause significant problems in limiting the performance characteristics of devices made on the substrates, or in some cases can preclude useful devices altogether. Current seeded sublimation techniques for the production of large bulk single crystals of silicon carbide typically result in a higher than desired concentration of defects on the growing surface of the silicon carbide crystal. Higher concentrations of defects can cause significant problems in limiting the performance characteristics of devices made on the crystals, or substrates resulting from the crystals. For example, a typical micropipe defect density in some commercially available silicon carbide wafers can be on the order of 100 per square centimeter ($cm^{-2}$). A megawatt device formed in silicon carbide, however, requires a defect free area on the order of 0.4 $cm^{-2}$. Thus, increasing the quality of large single crystals that can be used to fabricate large surface area devices for high-voltage, high current applications remains a worthwhile goal.

Although small samples of low-defect silicon carbide have been available, a broader commercial use of silicon carbide requires larger samples, and in particular, larger wafers. By way of comparison, 100 mm (4") silicon wafers have been commercially available since 1975 and 150 mm (6") silicon wafers became available in 1981. Gallium arsenide (GaAs) is also commercially available in both 4" and 6" wafers. Thus, the commercial availability of 50 mm (2") and 75 mm (3") SiC wafers lags behind these other materials and to some extent limits the adoption and use of SiC in a wider range of devices and applications.

Screw dislocations, particularly 1 c screw dislocations, are common defects that develop or propagate during the production of SiC crystals. Other surface defects include threading dislocations, hexagonal voids, and micropipes. If these defects remain in the SiC crystal, then resulting devices grown on the crystal may incorporate these defects.

The nature and description of specific defects is generally well understood in the crystal growth art. In particular, a screw dislocation is defined as one in which the Burgers Vector is parallel to the direction vector. On an atomic scale, the resulting dislocation gives the general appearance of a spiral staircase. The presence of a large number of screw dislocations can also lead to the presence of other defects, such as micropipes and hexagonal voids.

A micropipe is a hollow core super-screw dislocation with its Burgers vector lying along the c-axis. Micropipes are often formed from a grouping of 3 or more screw dislocations. A number of causes have been proposed or identified for the generation of micropipes. These include excess materials such as silicon or carbon inclusions, extrinsic impurities such as metal deposits, boundary defects, and the movement or slippage of partial dislocations. See e.g. Powell et al., Growth of Low Micropipe Density SiC Wafers, Materials Science Forum, Vols. 338-340, pp 437-440 (2000).

Hexagonal voids are flat, hexagonal platelet-shaped cavities in the crystal that often have hollow tubes trailing beneath them. Some evidence shows that micropipes are associated with hexagonal voids. A relatively recent discussion of such defects (exemplary and not limiting) is set forth in Kuhr et al., Hexagonal Voids And The Formation Of Micropipes During SiC Sublimation Growth, Journal of Applied Physics, Volume 89, No. 8, page 4625 (April 2001).

The presence of surface defects in bulk single crystals of SiC may also interfere with single-polytype crystal growth. The 150 available polytypes of SiC raise a particular difficulty. Many of these polytypes are very similar, often separated only by small thermodynamic differences. Maintaining the desired polytype identity throughout the crystal is only one difficulty in growing SiC crystals of large sizes in a seeded sublimation system. When surface defects are present, there is not enough polytype information on the crystal surface for depositing layers to maintain the desired polytype. Polytype changes on the surface of the growing crystal result in the formation of even more surface defects.

Recent research indicates that problems in the bulk crystals produced in a seeded sublimation technique can originate with the seed itself and the manner in which it is physically handled; e.g., Sanchez et al Formation Of Thermal Decomposition Cavities In Physical Vapor Transport Of Silicon Carbide, Journal of Electronic Materials, Volume 29, No. 3, page 347 (2000). Sanchez uses the term "micropipe" to describe, "approximately cylindrical voids with diameters in the range of 0.1 µm to 5 µm that form at the core of superscrew dislocations aligned parallel or nearly parallel to the [0001] axis" Id. at 347. Sanchez refers to larger voids ("diameters from 5 µm to 100 µm") as, "thermal decomposition cavities," and opines that micropipes and thermal decomposition cavities arise from different causes. Id.

Accordingly, producing larger high quality bulk single crystals of silicon carbide with low 1 c screw dislocation defect levels in crystals formed in the seeded sublimation system, in order to reduce the total number of defects in the produced crystals remains a constant technical and commercial goal.

SUMMARY

In one aspect, the present invention is a high quality single crystal wafer of SiC having a diameter of at least about 3 inches and a 1 c screw dislocation density of less than about 2000 $cm^{-2}$.

In another aspect, the invention is a SiC semiconductor precursor wafer having a diameter of at least about 3 inches and a 1 c screw dislocation density of less than about 2500 $cm^{-2}$.

In another aspect, the invention is a method of using a high quality single crystal wafer of SiC having a diameter of at least about 3 inches and a 1 c screw dislocation density of less than about 2500 $cm^{-2}$ in a seeded sublimation growth system.

In yet another aspect, the invention is power devices built on a single crystal seed of SiC having a diameter of at least about 3 inches and a 1 c screw dislocation density of less than about 2500 $cm^{-2}$.

DETAILED DESCRIPTION

The present invention relates to high quality silicon carbide wafers. In particular, the present invention incorporates several techniques for improving the growth of such wafers using seeded sublimation.

In one aspect, the present invention is a high quality single crystal wafer of SiC having a diameter of at least about 3 inches and a 1 c screw dislocation density less than about 2000 $cm^{-2}$, more preferably less than about 1500 $cm^{-2}$, and most preferably less than about 1000 $cm^{-2}$. The polytype of the single crystal SiC is preferably 3C, 4H, 6H, or 15R.

In considering the proportional dimensions of the diameter and thickness of the seed crystal, whether expressed as a percentage, a fraction, or a ratio, it will be understood that in the context of the improvements provided by the invention, these proportions have their inventive meaning in the context of the larger-diameter seed crystals that are described herein.

Accordingly, in certain embodiments the invention is described and claimed herein in the relevant embodiments in a manner that includes the absolute dimensions of the crystal, usually in terms of a diameter, of which 2 inch, 3 inch, and 100 mm diameter single crystals are preferred.

Figure 1:
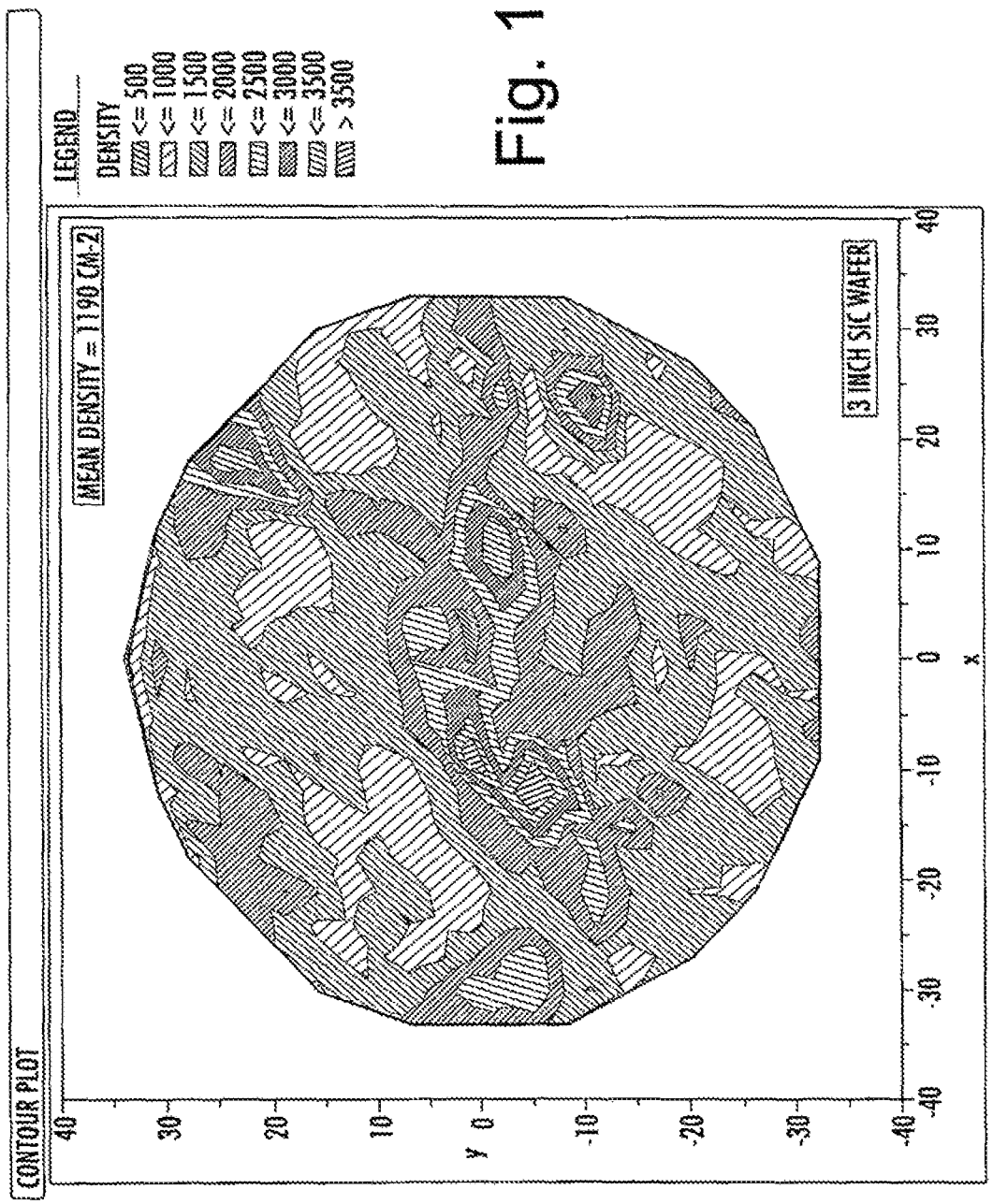
FIG. 1 is a map of a SiC wafer after defect etching in accordance with the present invention.

FIG. 1 is a map of a wafer 2 in accordance with the present invention. When appropriately counted, the average 1 c screw dislocation density of the wafer was 1190 $cm^{-2}$. As indicated by FIG. 1, measurable areas of crystals according to the present invention exhibit defect densities of less than 1000 $cm^{-2}$ and in some cases less than 500 $cm^{-2}$. Thus, as used herein the expression "less than" has both measured and predictive aspects. In addition to the measured aspects illustrated in FIG. 1, it is expected that some crystals will demonstrate even fewer defects. As a result, the phrase, "less than" as used herein also includes (but is not limited too) ranges such as 500-2500 $cm^{-2}$.

In another aspect, the invention is a high quality semiconductor precursor wafer. The wafer is a silicon carbide wafer of the 4H polytype, having a diameter of at least about 3 inches and a 1 c screw dislocation density on its surface of less than 2500 $cm^{-2}$. The count of total 1 c screw dislocations represents a count of total 1 c screw dislocations on the surface after an etch that preferentially emphasizes screw dislocation defects. The etch is preferably a molten potassium hydroxide etch.

In yet another aspect, the invention is a high quality semiconductor precursor wafer of silicon carbide having a 4H polytype, a diameter of at least about 3 inches, and less than 123,700 1 c screw dislocations on the surface of the wafer. Again, the surface 1 c screw dislocations represent a count after the molten potassium hydroxide etch.

Figure 2:
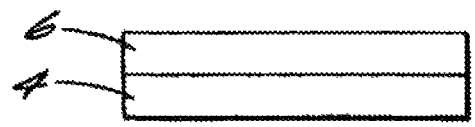
FIG. 2 is a semiconductor precursor wafer in accordance with the present invention.

In another aspect as schematically depicted in FIG. 2, the invention is a high quality silicon carbide semiconductor precursor wafer 4 having a 4H polytype, a diameter of at least about 3 inches, and a 1 c screw dislocation density on its surface of less than 2500 cm-2. The wafer additionally has a Group III-nitride layer 6 located on the surface. The Group III-nitride layer 6 is preferably one or more of GaN, Al GaN, AlN, AlInGaN, InN, and AlInN.

The growth and electronic characteristics of Group III nitrides are generally well-understood in this art. Group III nitride layers on silicon carbide substrates are a basic feature of certain types of light emitting diodes (LEDs). Among other desirable factors, the atomic fraction of the Group III element (e.g. $In_xGa_yN_{1-x-y}$) tailors the bandgap of the composition (within limits) to likewise tailor the resulting emission frequency and thus the color of the LED.

Figure 3:
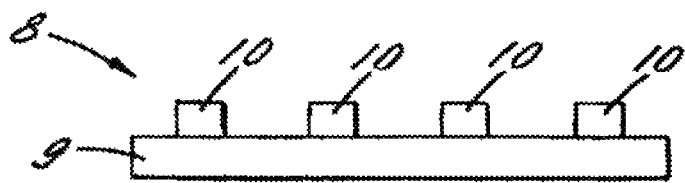
FIG. 3 is a plurality of semiconductor precursor devices in accordance with the present invention.

With respect to FIG. 3, the invention is a plurality of silicon carbide semiconductor device precursors 8 on a SiC seed 9 having a diameter of at least about 3 inches and a 1 c screw dislocation density on the surface of the wafer of less than 2500 cm-2. The wafer additionally has a plurality of respective Group III-nitride epitaxial layers 10 on some portions of the wafer. Preferred Group III-nitride epitaxial layers are individually selected from GaN, AlGaN, AlN, AlInGaN, InN, and AlInN In another aspect, the invention is a method of producing a high quality bulk single crystal of silicon carbide in a seeded sublimation system, the improvement includes growing a SiC boule having a diameter of at least about 3 inches and having a 1 c screw dislocation density of less than about 2500 $cm^{-2}$, thereafter slicing the SiC boule, preferably mechanically, into wafers, wherein each wafer has a 1 c screw dislocation density of less than about 2500 $cm^{-2}$ on the surface. The wafers are preferably about 0.5 mm thick.

It may be preferable to then polish and etch the SiC wafers. A preferred polish is a chemo-mechanical polish and a preferred etch is a molten KOH etch. The etch is carried out in order to highlight the defects on the surface, and is unnecessary as a precursor step to seeded sublimation. Thus, sublimation growth is typically carried out on a polished seed that has not been etched.

As is known in the art, the SiC boule is preferably grown in a seeded sublimation system. After the boule is sliced into wafers, the wafers may then, in turn, be used as the seed in a seeded sublimation growth of a single crystal of silicon carbide.

As noted in the background portion of the specification, the general aspects of seeded sublimation growth of silicon carbide have been generally well established for a number of years. Furthermore, those familiar with the growth of crystals, particularly in difficult material systems such as silicon carbide, will recognize that the details of a given technique can and will vary, usually purposefully, depending upon the relevant circumstances. Accordingly, the descriptions given herein are most appropriately given in a general and schematic sense with the recognition that those persons of skill in this art will be able to carry out the improvements of the invention based on the disclosures herein without undue experimentation.

In describing the invention, it will be understood that a number of techniques are disclosed. Each of these has individual benefit, and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

Figure 4:
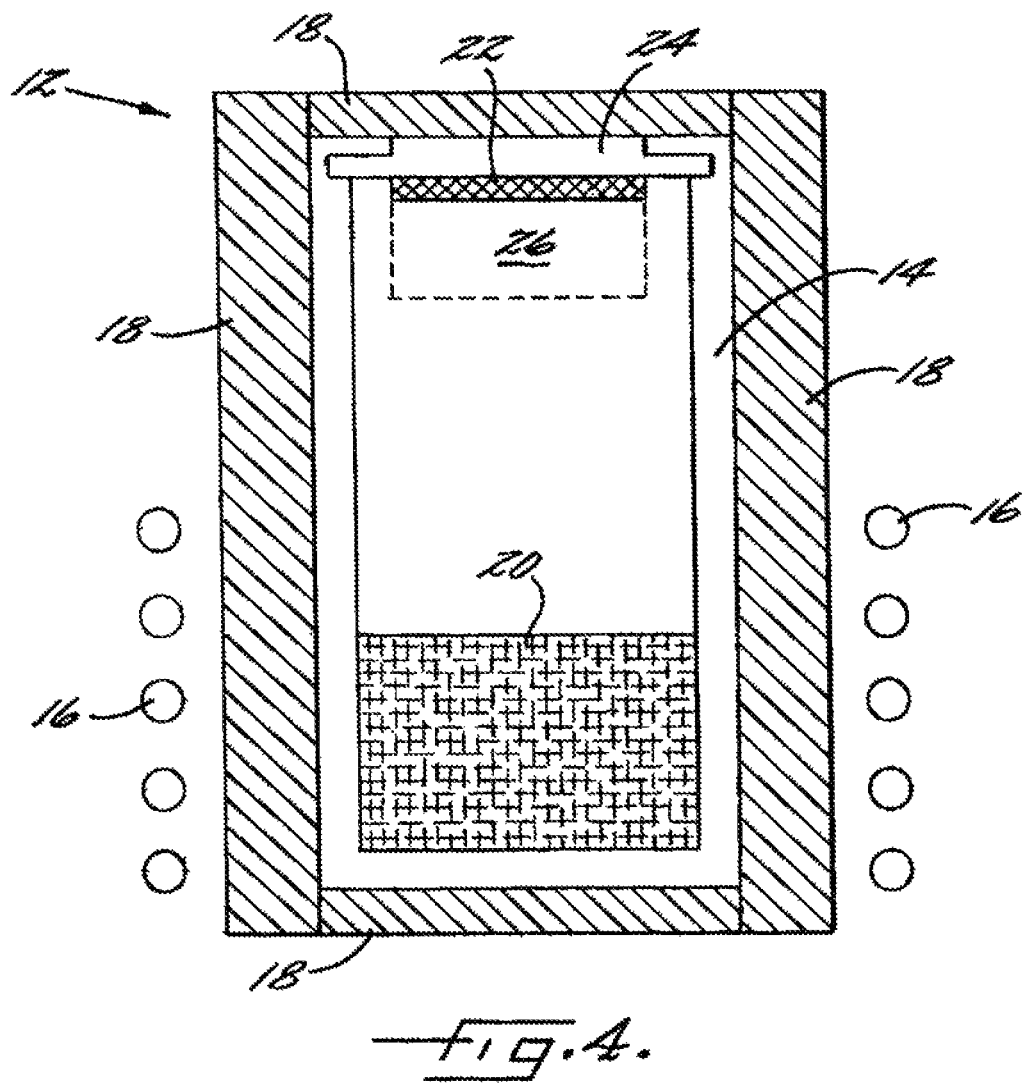
FIG. 4 is a schematic cross-sectional view of a seeded sublimation system in accordance with the present invention.

FIG. 4 is a cross sectional schematic diagram of a sublimation system for seeded sublimation growth of the type contemplated as useful in the present invention. The system is broadly designated at 12. As in most typical systems, the system 12 includes a graphite susceptor, or crucible, 14 and a plurality of induction coils 16 that heat the susceptor 14 when current is applied through the coils 16. Alternatively, some systems incorporate resistance heating. It will be understood by those familiar with these crystal growth techniques that the system can be further enclosed in some circumstances, e.g., in a water-cooled vessel. Additionally, at least one gas inlet and outlet (not shown) in communication with the susceptor 14 are included in the seeded sublimation system 12. Such further enclosures are, however, less relevant to the invention and are omitted herein to help clarify the drawing and description. Additionally, those persons skilled in this art recognize that silicon carbide sublimation systems of the type described herein are available both commercially and as constructed in a custom fashion as may be necessary or appropriate. They accordingly can be selected or designed by those of ordinary skill in this art without undue experimentation.

The susceptor 14 is typically surrounded by insulation 18, several portions of which are illustrated in FIG. 4. Although FIG. 4 illustrates the insulation as being generally consistent in size and placement, it will be understood and is recognized by those of skill in the art that the placement and amount of the insulation 18 can be used to provide desired thermal gradients (both axially and radially) along the susceptor 14. Again, for purposes of simplification, these possible permutations are not illustrated herein.

The susceptor 14 includes one or more portions for containing a silicon carbide powder source 20. Such a powder source 20 is most commonly—although not exclusively—used in seeded sublimation growth techniques for silicon carbide. FIG. 4 illustrates the powder source 20 as being contained in a lower portion of the susceptor 14 and this is one typical arrangement. As another familiar variation, some systems distribute the source powder in a vertical, cylindrical arrangement in which the source powder surrounds a larger portion of the interior of the susceptor 14 than does the arrangement illustrated in FIG. 4. The invention described herein can be appropriately carried out using both types of equipment.

A silicon carbide seed is designated at 22, and is typically placed in upper portions of the susceptor 14. The seed 22 is preferably a monocrystalline SiC seed having a diameter of at least about 75 mm and having a micropipe density of less than about 25 $cm^{-2}$ on the surface. A growing crystal 26 is deposited on the seed 22 during the seeded sublimation growth.

A seed holder 28 typically holds the seed 22 in place with the seed holder 28 being attached to the susceptor 14 in an appropriate fashion. This can include various resting or threaded arrangements. In the orientation illustrated in FIG. 4, the upper portions of the seed holder 28 would typically include threads as would the uppermost portions of the susceptor 14, preferably a graphite crucible, so that the seed holder 28 could be threaded into the top of the susceptor 14 to hold the seed 22 in the desired position. The seed holder 28 is preferably a graphite seed holder.

It may be preferable to place the seed 22 in the crucible 14 while exerting minimal torsional forces on the seed 22 to thereby prevent torsional forces from warping or bowing the crystal in a manner that would otherwise encourage undesired thermal differences across the seed 22.

In some embodiments it may be desirable to anneal the seed holder 28 prior to attaching the seed 22. Annealing the seed holder 28 prior to sublimation growth prevents the seed holder 28 from undergoing significant distortion during crystal growth at SiC sublimation temperatures Annealing the seed holder 28 also minimizes or eliminates temperature differences across the seed 22 that would otherwise tend to initiate and propagate defects in a growing crystal. A preferred process for annealing the seed holder 28 includes annealing at temperatures at or about 2500° C. for at least about 30 minutes.

In some embodiments, it may be preferred to include dopant atoms in the sublimation system 12. Introducing dopant gases to the seeded sublimation system 12 incorporates dopant atoms in a growing crystal. Dopants are selected for their acceptor or donor capabilities. Donor dopants are those with n-type conductivity and acceptor dopants are those with p-type conductivity. Preferred dopant atoms include n-type and p-type dopant atoms. Especially preferred n-type dopants include N, P, As, Sb, Bi, and mixtures thereof. Especially preferred p-type dopants include B, Al, Ga, In, Tl, and mixtures thereof.

The general scheme for sublimation growth is set forth briefly in the Background portion of the specification, as well as in other sources well-known to those of ordinary skill in this art. Typically, an electric current, having a frequency to which the susceptor 14 responds, is passed through the induction coils 16 to heat the graphite susceptor 14. The amount and placement of the insulation 18 are selected to create a thermal gradient between the powder source 20 and the growing crystal 26 when the susceptor 14 heats the powder source 20 to sublimation temperatures, which are typically above about 2000° C. The thermal gradient is established to maintain the temperature of the seed 22 and thereafter a growing crystal near, but below, the temperature of the silicon carbide source to thereby thermodynamically encourage the vaporized species that are generated when silicon carbide sublimes (Si, Si2C, and SiC2) to condense first upon the seed crystal and thereafter upon the growing crystal; e.g., U.S. Pat. No. 4,866,005.

After reaching the desired crystal size, growth is terminated by reducing the temperature of the system to below about 1900° C. and raising the pressure to above about 400 torr.

It may be further desirable to anneal the crystal after completion of the sublimation growth process. The crystal may be annealed at temperatures at or above the growth temperature for a period typically of about 30 minutes.

For purposes of clarity, the singular term, "thermal gradient," will be used herein, but it will be understood by those of skill in this art that several gradients can desirably co-exist in the susceptor 14 and can be subcategorized as axial and radial gradients, or as a plurality of isotherms.

If the temperature gradients and other conditions (pressure, carrier gases, etc.) are properly maintained, the overall thermodynamics will encourage the vaporized species to condense first on the seed 22 and then on the growing crystal 26 in the same polytype as the seed 22.

As generally noted in the Background, the performance properties of electronic devices will typically improve as the crystal quality of the various device portions improves.

Thus, the reduced-defect characteristics of wafers of the present invention similarly provide improved devices. Thus, in another aspect, the invention is a plurality of field-effect transistors formed on low-defect 3 inch silicon carbide wafers. Each field-effect transistor includes a bulk single crystal silicon carbide substrate wafer of at least about 3 inches diameter and having a 1 c screw dislocation density of less than 2500 cm$^{-2}$.

Figure 5:
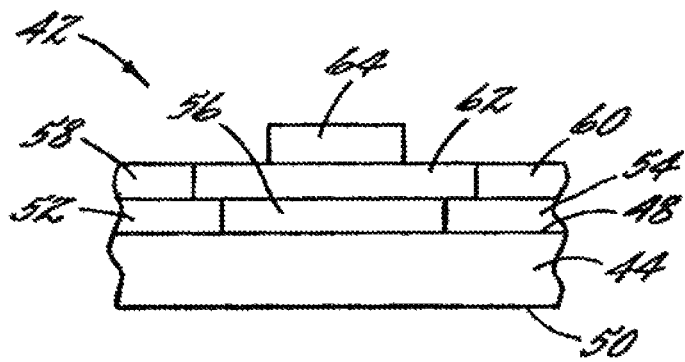
FIG. 5 is a schematic cross-sectional view of a metal oxide semiconductor field effect transistor in accordance with the present invention.

In another aspect, the invention is a plurality of metal oxide semiconductor field effect transistors (MOSFETs) 42 formed on low defect 3 inch silicon carbide substrate 44. FIG. 5 is a schematic cross-sectional illustration of a basic MOSFET structure. Each MOSFET 42 includes a bulk single crystal silicon carbide substrate wafer 44 of at least about 3 inches diameter and a 1 c screw dislocation density of less than 2500 cm-2. The bulk single crystal substrate 44 includes a respective first surface 48 and second surface 50 opposite one another. An epitaxial layer on the substrate has respective source 52, channel 56, and drain 54 portions with the channel 56 being controlled by the gate contact 64 through the oxide layer 62. Respective source and drain contacts 58, 60 are on the source and drain portions 52, 54. The structure and operation of MOSFETs, and of combinations and variations of MOSFETs, is well understood in this art and thus FIG. 5 and its description are exemplary rather than limiting of the claimed invention.

Figure 6:
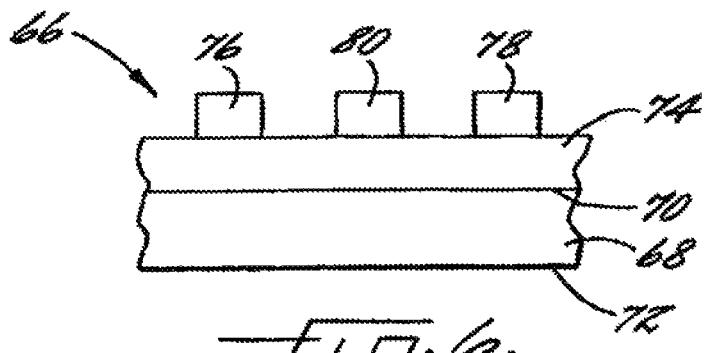
FIG. 6 is a schematic cross-sectional view of a metal semiconductor field effect transistor in accordance with the present invention.

With reference to FIG. 6, in another aspect the invention is a plurality of metal semiconductor field effect transistors (MESFETs) 66 formed on low defect 3 inch silicon carbide. Each MESFET 66 includes a bulk single crystal silicon carbide substrate wafer 68 of at least about 3 inches and having a 1 c screw dislocation density of less than 2500 cm-2. The substrate 68 includes a respective first surface 70 and second surface 72 opposite one another. A conductive channel 74 is located on the first surface 70 of the substrate 68. Ohmic source 76 and a drain 78 contacts are located on the conductive channel 74. A metal gate contact 80 is located between the source 76 and drain 78 on the conductive channel 74 for forming an active channel when a bias is applied to the metal gate contact 80.

As is known in the art, more than one type of device may be situated on a silicon carbide wafer in accordance with the present invention. Additional devices that may be included are junction-field effect transistors, hetero field effect transistors, diodes, and other devices known in the art. The structure and operation of these (and other) devices are well-understood in this art and can be practiced using the substrates described and claimed herein without undue experimentation.

In the specification and the drawings, typical embodiments of the invention have been disclosed. Specific terms have been used only in a generic and descriptive sense, and not for purposes of limitation. The scope of the invention is set forth in the following claims.

The invention claimed is:

1. A single crystal wafer of SiC having a diameter of at least about 3 inches and a 1 c screw dislocation density from about 55 cm$^{-2}$ to about 2500 cm$^{-2}$.

2. A single crystal wafer of SiC according to claim 1 wherein the 1 c screw dislocation density is less than about 1500 cm$^{-2}$.

3. A single crystal wafer of SiC according to claim 1 wherein the 1 c screw dislocation density is less than about 1200 cm$^{-2}$.

4. A single crystal wafer of SiC according to claim 1 wherein the crystal has a polytype selected from the group consisting of the 3C, 4H, 6H, 2H, and 15R polytypes.

5. A single crystal wafer of SiC according to claim 1 wherein the 1 c screw dislocation density is less than about 2000 cm$^{-2}$.

6. A single crystal wafer of SiC according to claim 1 wherein the wafer is less than about 5 inches in diameter.

7. A high quality semiconductor precursor wafer comprising:
    a single crystal silicon carbide wafer having a diameter of at least about 3 inches;
    said wafer having the 4H polytype; and
    said wafer having a 1 c screw density on its surface is from about 500 cm$^{-2}$ to about 2500 cm$^{-2}$.

8. A high quality semiconductor precursor wafer according to claim 7 wherein said surface 1 c screw dislocation density represents a count of the 1 c screw dislocations on said surface following an etch that preferentially emphasizes 1 c screw dislocation defects.

9. A high quality semiconductor precursor wafer according to claim 8 wherein said surface 1 c screw dislocation density represents a count of the total 1 c screw dislocations on said surface following an etch of the surface in molten potassium hydroxide.

10. A high quality semiconductor precursor wafer comprising:
   a single crystal silicon carbide wafer having a diameter of at least about 3 inches;
   said wafer having the 4H polytype;
   said wafer having a 1 c screw dislocation density on its surface is from about 500 $cm^{-2}$ to about 2500 $cm^{-2}$; and
   a Group III-nitride layer on said surface of said silicon carbide wafer.

11. A semiconductor precursor wafer according to claim 10 wherein said Group III-nitride layer is selected from the group consisting of GaN, AlGaN, AN, AlInGaN, InN, AlInN and mixtures thereof.

12. A plurality of semiconductor device precursors comprising:
   a single crystal silicon carbide wafer having a diameter of at least about 3 inches and a 1 c screw dislocation density on the surface is from about 500 $cm^{-2}$ to about 2500 $cm^{-2}$; and
   a plurality of respective Group III-nitride epitaxial layers on some portions of said wafer.

13. A semiconductor wafer comprising:
   a single crystal silicon carbide substrate of at least about 3 inches and having a 1 c screw dislocation density is from about 500 $cm^{-2}$ to about 2500 $cm^{-2}$; and
   a plurality of devices on said silicon carbide substrate, each said device comprising:
      an epitaxial layer located on the substrate, said layer having a concentration of suitable dopant atoms for making the epitaxial layer a first conductivity type, and respective source, channel, and drain portions;
      a metal oxide layer on said channel portion; and
      and a metal gate contact on said metal oxide layer for forming an active channel when a bias is applied to said metal gate contact.

14. A semiconductor wafer comprising:
   a single crystal silicon carbide substrate of at least about 3 inches and having a 1 c screw dislocation density is from about 500 $cm^{-2}$ to about 2500 $cm^{-2}$; and
   a plurality of devices on said silicon carbide substrate, each said device comprising:
      a conductive channel on said substrate;
      a source and a drain on said conductive channel; and
      a metal gate contact between said source and said drain on said conductive channel for forming an active channel when a bias is applied to the metal gate contact.

15. A semiconductor wafer comprising:
   a single crystal silicon carbide substrate of at least about 3 inches and having a 1 c screw dislocation density is from about 500 $cm^{-2}$ to about 2500 $cm^{-2}$; and
   a plurality of junction field-effect transistors positioned on said single crystal silicon carbide substrate.

16. A semiconductor wafer comprising:
   a single crystal silicon carbide substrate of at least about 3 inches and having a 1 c screw dislocation density is from about 500 $cm^{-2}$ to about 2500 $cm^{-2}$; and
   a plurality of hetero-field effect transistors positioned on said single crystal silicon carbide substrate.

17. A semiconductor wafer comprising:
   a bulk single crystal silicon carbide substrate of at least about 3 inches and having a 1 c screw dislocation density of less than 2500 $cm^{-2}$, said bulk single crystal having respective first and second surfaces opposite one another; and
   a plurality of diodes positioned on said single crystal silicon carbide substrate.

18. A single crystal wafer of SiC having a diameter between about 3 inches and about 5 inches and a 1 c screw dislocation density from about 500 $cm^{-2}$ to about 2500 $cm^{-2}$.

19. A single crystal wafer of SiC according to claim 18 wherein the 1 c screw dislocation density is less than about 2000 $cm^{-2}$.

20. A single crystal wafer of SiC according to claim 18 wherein the 1 c screw dislocation density is less than about 1500 $cm^{-2}$.

21. A single crystal wafer of SiC according to claim 18 wherein the 1 c screw dislocation density is less than about 1200 $cm^{-2}$.

* * * * *